(12) United States Patent
Engstrand

(10) Patent No.: US 7,626,153 B2
(45) Date of Patent: Dec. 1, 2009

(54) SYSTEM AND/OR METHOD FOR READING, MEASURING AND/OR CONTROLLING INTENSITY OF LIGHT EMITTED FROM AN LED

(75) Inventor: Bradley W. Engstrand, Hartford, WI (US)

(73) Assignee: Phaedrus, LLC, Hartford, WI (US)

( * ) Notice: Subject to any disclaimer, the term of this patent is extended or adjusted under 35 U.S.C. 154(b) by 2 days.

(21) Appl. No.: 11/975,777

(22) Filed: Oct. 22, 2007

(65) Prior Publication Data

US 2009/0101794 A1    Apr. 23, 2009

(51) Int. Cl.
- *G01J 1/32* (2006.01)
- *H01J 40/14* (2006.01)
- *F21V 7/04* (2006.01)
- *H01L 29/267* (2006.01)

(52) U.S. Cl. ................ 250/205; 250/239; 362/612; 362/619; 257/81

(58) Field of Classification Search ........... 250/216, 250/221, 214.1, 214 LA, 228, 239, 552, 553, 250/578.1, 204, 205; 356/364; 362/609, 362/612, 618, 619, 622–625; 257/80–82, 257/88–89
See application file for complete search history.

(56) References Cited

U.S. PATENT DOCUMENTS

| | | | |
|---|---|---|---|
| 4,777,359 A | * | 10/1988 | Havel ................... 250/229 |
| 6,952,009 B1 | | 10/2005 | Engstrand |
| 7,180,053 B2 | | 2/2007 | Engstrand |
| 7,291,830 B1 | | 11/2007 | Engstrand |
| 7,294,823 B2 | | 11/2007 | Engstrand |
| 2007/0069163 A1 | | 3/2007 | Engstrand |
| 2007/0075226 A1 | | 4/2007 | Engstrand |
| 2007/0075227 A1 | | 4/2007 | Engstrand |
| 2007/0075228 A1 | | 4/2007 | Engstrand |
| 2007/0075229 A1 | | 4/2007 | Engstrand |
| 2007/0246644 A1 | | 10/2007 | Engstrand |
| 2007/0289443 A1 | | 12/2007 | Engstrand |

\* cited by examiner

*Primary Examiner*—Georgia Y Epps
*Assistant Examiner*—Don Williams
(74) *Attorney, Agent, or Firm*—Patents+TMS, P.C.

(57) ABSTRACT

A system and/or a method for reads, measures and/or controls intensity of light emitted from a light-emitting diode (LED). The system and/or the method have a light intensity detector adjacent to the LED for reading and/or measuring the intensity of light emitted from the LED. The system and/or the method have a control circuit that may be electrically connected to both the detector and/or the LED for measuring and/or for controlling an intensity of light emitted from the LED. A housing surrounds the light detector and/or the LED. The housing has a pathway that allows only light emitted from the LED to reach the light detector. The LED has a finish and/or a coating that eliminates and/or retards absorption of light by internal components of the LED. The finish and/or the coating eliminates and/or retards reflection of the light by the LED.

15 Claims, 3 Drawing Sheets

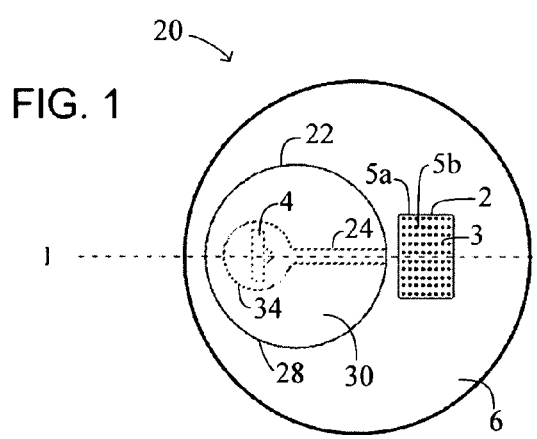
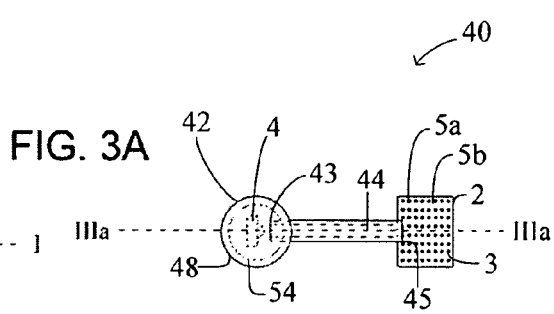
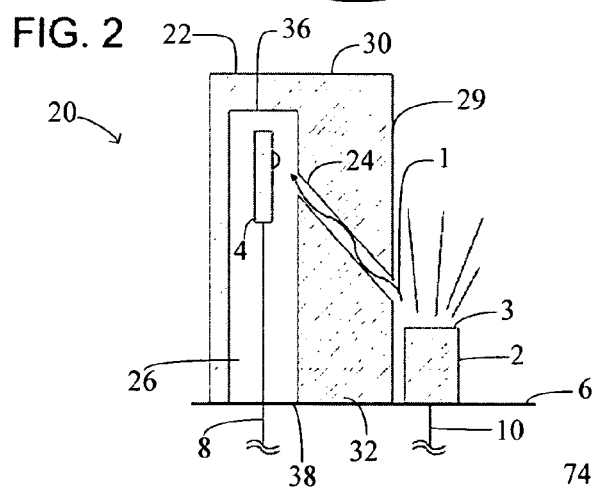
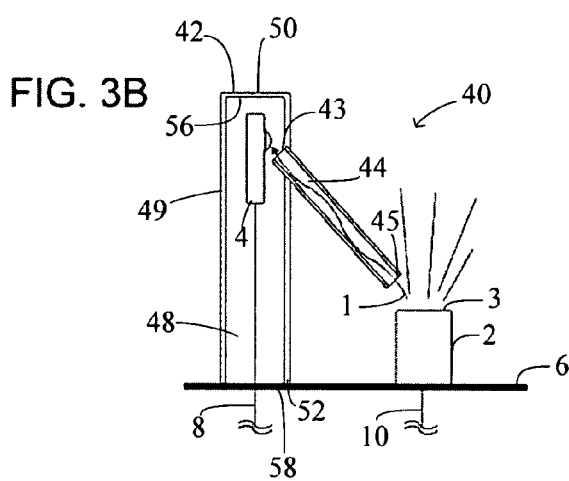
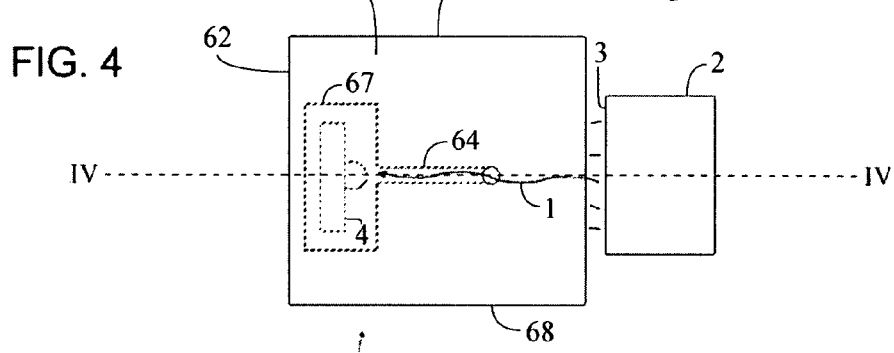
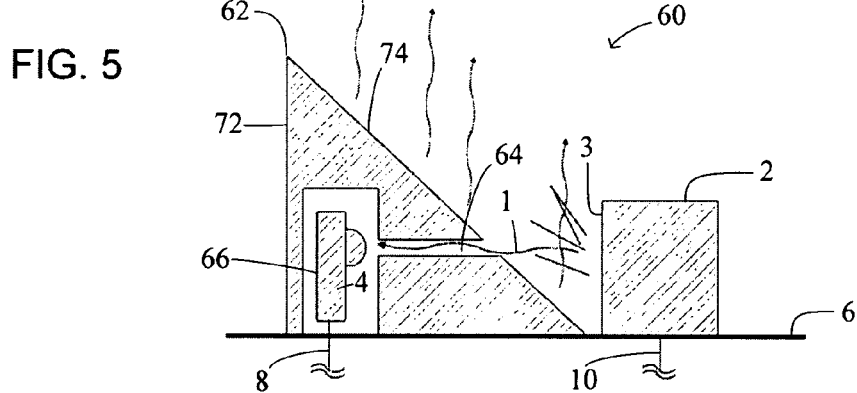

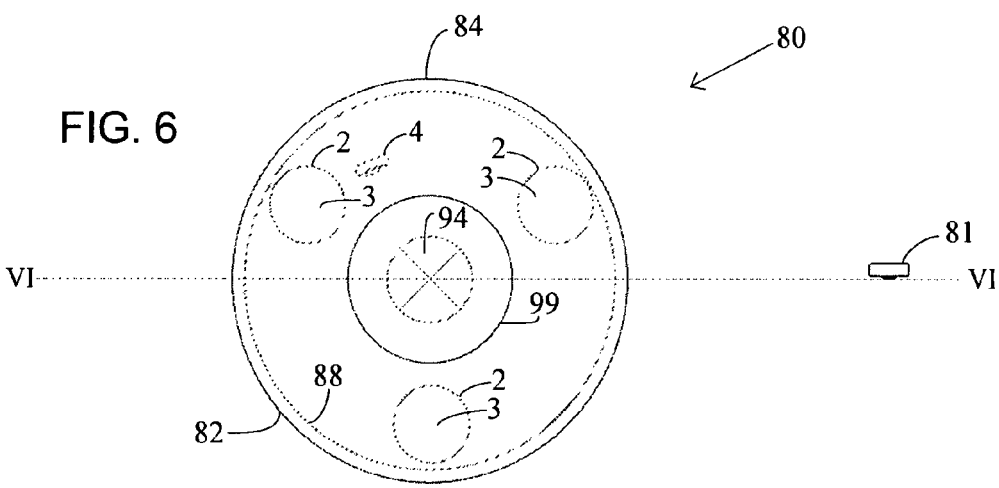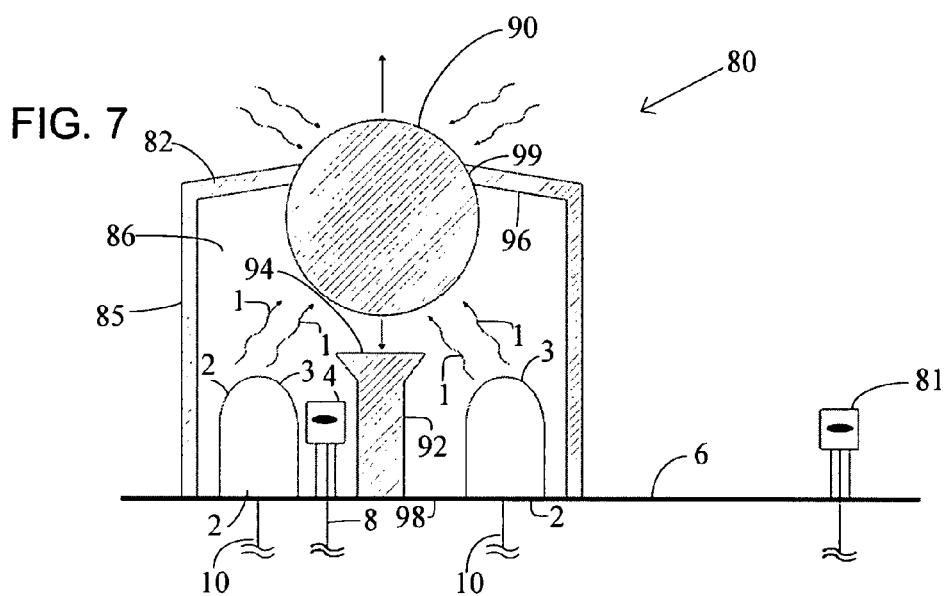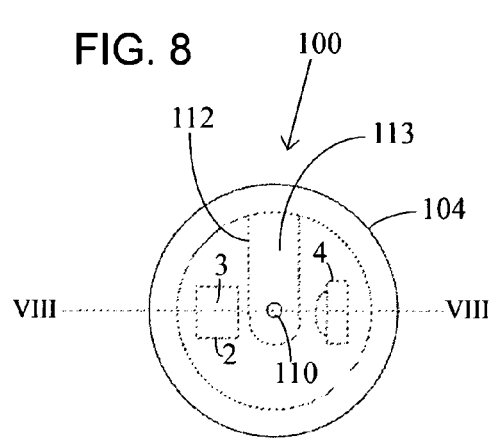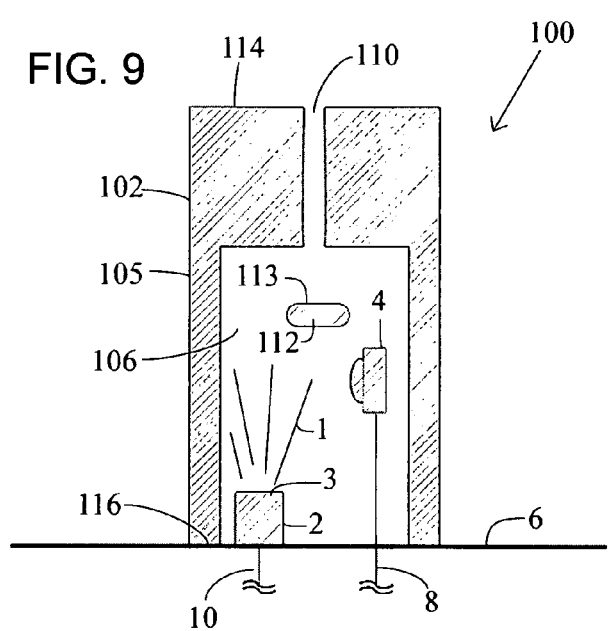

SYSTEM AND/OR METHOD FOR READING, MEASURING AND/OR CONTROLLING INTENSITY OF LIGHT EMITTED FROM AN LED

BACKGROUND OF THE INVENTION

The present invention generally relates to a system and/or a method for reading, measuring and/or controlling intensity of light emitted from a light-emitting diode (LED). More specifically, the present invention relates to a system and/or a method that may prevent and/or may retard reflection of ambient light from a surface of the LED to allow an accurate reading and/or an accurate measurement of the intensity of light emitted from the LED. The system and/or the method may have a light detector located in a position adjacent to the LED for reading and/or measuring the intensity of light emitted from the LED. The system and/or the method may have a control circuit that may be connected to both the detector and the LED for measuring and/or controlling intensity of light emitted from the LED. A housing may surround the light detector that may have provide a pathway that may allow only light emitted from the LED to reach the light detector. The housing and the pathway may limit and/or may prevent exposure of the light detector to ambient light that may not be emitted directly from the LED towards the light detector.

It is generally known that an LED is a semiconductor diode that has a chip of semiconducting material doped with impurities to create a p-n junction. The semiconductor diode emits light when the same is electrically biased in a forward direction of the p-n junction. The emitted light may be, for example, infrared light, visible light and/or near ultraviolet light. Further, the color of the emitted light varies depending on the semiconducting material used. Additionally, optics are added to the chip to shape a radiation pattern of the emitted light.

Further, it is generally known that an intensity of the emitted light varies over time. The intensity of the emitted light may be controlled by varying a voltage and/or a current of electricity applied to the LED. Therefore, control systems are provided to measure intensity of emitted light and to control the voltage and/or the current applied to the LED to produce a more stable intensity of emitted light over time.

However, the LED is often used in open systems where the LED may be exposed to ambient light. The ambient light may be emitted from light sources external to the LED. The ambient light may be light emitted from the LED that has been reflected from a surface located adjacent to the LED. It is generally known that ambient light is absorbed and/or reflected by the LED and/or the semiconducting material. Absorption of the ambient light by the semiconducting material alters the properties of the semiconducting material and contributes to the varying intensity of emitted light. Moreover, ambient light is often passively detected by the control systems. Therefore, known control systems measure intensity of emitted light and, inadvertently, ambient light to control the voltage and/or the current applied to the LED. As a result, the intensity of light emitted from the LED used with known control systems varies substantially over time even when used in conjunction with known control systems designed to prevent the same.

A need, therefore, exists for a system and/or a method for reading, measuring and/or controlling intensity of light emitted from an LED. Additionally, a need exists for a system and/or a method that may prevent and/or may retard reflection of ambient light from a surface of the LED to allow an accurate reading and/or an accurate measurement of the intensity of light emitted from the LED. Further, a need exists for a system and/or a method that may prevent absorption of ambient light by a semiconducting material of the LED to control intensity of light emitted from the LED. Still further, a need exists for a light detector that may be exposed only to light emitted by the LED. Still further, a need exists for a control circuit that may be electrically connected to both the light detector and the LED for measuring and/or for controlling intensity of light emitted from the LED. Still further, a need exists for a housing that may surround the light detector to limit exposure of the light detector to ambient light. Moreover, a need exists for a pathway in the housing that may allow only light emitted from the LED to reach the light detector.

SUMMARY OF THE INVENTION

The present invention generally relates to a system and/or a method for reading, measuring and/or controlling intensity of light emitted from a light-emitting diode (LED). More specifically, the present invention relates to a system and/or a method that may prevent and/or may retard reflection of ambient light from an emitting surface of the LED to allow an accurate reading and/or an accurate measurement of the intensity of light emitted from the LED.

An emitting surface of the LED may be modified to reduce reflection of ambient light from the emitting surface and/or to limit exposure of internal components of the LED to ambient light. The system and/or the method may have a light detector located in a position adjacent to the LED for reading and/or measuring the intensity of light emitted from the LED. The system and/or the method may have a control circuit that may be electrically connected to both the detector and the LED for measuring and/or controlling intensity of light emitted from the LED. The control circuit may monitor the intensity of the light emitted from the LED that may be read and/or measured by the light detector. As a result, the control circuit, by way of a negative feedback loop mechanism, may regulate a voltage and/or a current of electricity applied to the LED to control the intensity of light emitted from the LED.

The system and/or the method may have a housing that may surround the light detector. The housing may have a pathway that may allow only light emitted from the LED to reach the light detector. An angle of the pathway relative to the LED and/or a location of the pathway relative to an illuminated environment within which the LED and/or the housing are situated may limit and/or may prevent exposure of the light detector to ambient light that may not be emitted directly from the LED towards the light detector.

The LED and the light detector may both be located in a chamber designed to limit exposure of both the LED and the light detector to ambient light. The chamber may have an aperture for allowing light emitted from the LED to exit the chamber to illuminate an environment in which the chamber is located. Further, the chamber may limit exposure of the LED and/or the light detector to ambient light that may enter the chamber via the aperture.

The system and/or the method may have a surface to reflect light emitted from the LED away from the detector and/or to illuminate an environment that is not directly opposite from the emitting surface of the LED.

To this end, in an embodiment of the present invention, a system for controlling light emitted from a light source in an environment having ambient light is provided. The system has an LED to emit light wherein the light emitted from the LED has an intensity wherein the LED has an emitting surface to transmit the light emitted from the LED wherein the emitting surface has a finish to reduce reflection of the ambient light from the emitting surface. Further, the system has a detector adjacent to the LED to detect the intensity of the light emitted from the LED. Still further, the system has a control circuit for monitoring the intensity of the light detected by the detector wherein the control circuit is electrically connected to the detector and the LED wherein the control circuit regulates the intensity of light emitted by the LED. Moreover, the system has a tower having an internal compartment that surrounds the detector wherein the tower prevents exposure of the detector to the ambient light wherein the tower has an external surface and a pathway wherein the pathway is located between the detector inside the internal compartment and the external surface for transmitting light emitted from the LED to the detector in the compartment.

In an embodiment, the tower is constructed from an opaque material.

In an embodiment, the system has a channel in the tower that extends from the internal compartment to the external surface of the tower.

In an embodiment, the system has a pipe that extends from the internal compartment past the external surface of the tower to a position adjacent to the emitting surface of the LED.

In an embodiment, the system has a mirror on the external surface of the tower that reflects the light emitted from the LED away from the tower.

In an embodiment, the system has a surface that is substantially flat wherein the tower and the LED are mounted to the surface wherein the surface is a printed circuit board.

In an embodiment, the system has a power source electrically connected to the control circuit wherein the power source provides power to the LED.

In an embodiment, the emitting surface is abraded to reduce reflection of ambient light from the emitting surface.

In an embodiment, the system has a coating on the emitting surface that reduces reflection of the ambient light from the emitting surface.

In another embodiment, a system for reading light emitted from a light source in an environment having ambient light is provided. The system has an LED to emit light wherein the light emitted from the LED has an intensity wherein the LED has an emitting surface having a finish to reduce reflection of light from the emitting surface. Further, the system has a first detector adjacent to the LED to detect the intensity of light emitted from the LED. Still further, the system has a chamber in the environment having an internal compartment that surrounds the first detector and the LED wherein the chamber has an aperture to allow transmission of the light emitted from the LED out of the chamber wherein the aperture allows transmission of the ambient light into the chamber. Moreover, the system has means for preventing exposure of the LED and the first detector to the ambient light that is transmitted into the chamber through the aperture wherein the means for preventing allows the light emitted from the LED to exit the chamber through the aperture.

In an embodiment, the system has a control circuit for monitoring the intensity of light detected by the detector wherein the control circuit is electrically connected to the first detector and the LED wherein the control circuit regulates the intensity of light emitted from the LED.

In an embodiment, the system has a lens sized to fit into the aperture wherein the lens focuses the light emitted from the LED through the aperture to the environment wherein the lens focuses the ambient light from the environment onto the means for preventing.

In an embodiment, the system has a surface located between the aperture and the first detector wherein the surface absorbs the ambient light that is transmitted through the aperture into the internal compartment of the chamber.

In an embodiment, the system has a surface located between the aperture and the first detector wherein the surface reflects the ambient light that is transmitted through the aperture into the chamber through the aperture.

In an embodiment, the system has a second detector located in a position outside of the chamber to detect an intensity of the ambient light in the environment outside of the chamber.

In another embodiment, a method for controlling light emitted from a light source in an environment having ambient light is provided. The method has the step of providing a first light intensity detector, an LED having an emitting surface to transmit light emitted from the LED, a control circuit and a housing wherein the housing is located in a position adjacent to the LED wherein the first light intensity detector is located in a position within the housing wherein the housing has a pathway for allowing the light emitted directly from the LED to reach the detector wherein the control circuit is electrically connected to the detector and the LED. Further, the method has the step of detecting an intensity of the light emitted from the LED through the pathway onto the detector. Moreover, the method has the step of adjusting the intensity of light emitted from the LED.

In an embodiment, the method has the step of modifying the emitting surface of the LED to reduce reflection of the ambient light from the emitting surface.

In an embodiment, the method has the step of providing a second light intensity detector located in a position outside of the housing wherein the second light intensity detector measures intensity of the ambient light.

In an embodiment, the method has the step of applying a coating to the emitting surface of the LED wherein the coating reduces reflection of the ambient light from the emitting surface.

In an embodiment, the method has the step of abrading the emitting surface of the LED to reduce reflection of the ambient light from the emitting surface.

It is, therefore, an advantage of the present invention to provide a system and/or a method for reading, measuring and/or controlling intensity of light emitted from an LED.

Another advantage of the present invention is to provide a system and/or a method for reading, measuring and/or controlling intensity of light emitted from an LED that may allow an accurate reading and/or an accurate measurement of the intensity of light emitted from the LED.

And, another advantage of the present invention is to provide a system and/or a method for reading, measuring and/or controlling intensity of light emitted from an LED that may have a light detector located in a position adjacent to the LED for reading and/or measuring the intensity of light emitted from the LED.

Yet another advantage of the present invention is to provide a system and/or a method for reading, measuring and/or controlling intensity of light emitted from an LED that may have a control circuit that may be electrically connected to both the detector and the LED for measuring and/or controlling intensity of light emitted from the LED.

A further advantage of the present invention is to provide a system and/or a method for reading, measuring and/or controlling intensity of light emitted from an LED that may have a housing that may surround the light detector.

Moreover, an advantage of the present invention is to provide a system and/or a method for reading, measuring and/or controlling intensity of light emitted from an LED that may have a housing and a pathway that may allow only light emitted from the LED to reach the light detector.

And, another advantage of the present invention is to provide a system and/or a method for reading, measuring and/or controlling intensity of light emitted from an LED that may limit and/or may prevent exposure of the light detector to ambient light that may not be emitted directly from the LED towards the light detector.

Yet another advantage of the present invention is to provide a system and/or a method for reading, measuring and/or controlling intensity of light emitted from an LED that may prevent and/or may retard reflection of ambient light from a surface of the LED to allow an accurate reading and/or an accurate measurement of the intensity of light emitted from the LED.

Another advantage of the present invention is to provide a system and/or a method for reading, measuring and/or controlling intensity of light emitted from an LED that may prevent absorption of ambient light by a semiconducting material of the LED to better control intensity of light emitted from the LED.

Yet another advantage of the present invention is to provide a system and/or a method for reading, measuring and/or controlling intensity of light emitted from an LED wherein an emitting surface of the LED retards reflection of ambient light from the emitting surface and/or limits exposure of internal components of the LED to ambient light.

A still further advantage of the present invention is to provide a system and/or a method for reading, measuring and/or controlling intensity of light emitted from an LED wherein the light detector and the LED may both be located in a chamber designed to limit exposure of both the LED and the light detector to ambient light.

Moreover, an advantage of the present invention is to provide a system and/or a method for reading, measuring and/or controlling intensity of light emitted from an LED that may have a chamber for the LED and a light detector that may have an aperture for allowing light emitted from the LED to exit the chamber to illuminate an environment in which the chamber is located.

And, another advantage of the present invention is to provide a system and/or a method for reading, measuring and/or controlling intensity of light emitted from an LED that may have a chamber for housing the LED and a light detector that limits exposure of the LED and/or the light detector to ambient light that may enter the chamber via an aperture in the chamber.

Yet another advantage of the present invention is to provide a system and/or a method for reading, measuring and/or controlling intensity of light emitted from an LED that may have a surface to reflect light emitted from the LED away from a detector and/or to illuminate an environment that is not directly opposite from the emitting surface of the LED.

Moreover, an advantage of the present invention is to provide a system and/or a method for reading, measuring and/or controlling intensity of light emitted from an LED that may maintain a generally uniform and/or constant intensity of light emitted from the LED.

And, another advantage of the present invention is to provide a system and/or a method for reading, measuring and/or controlling intensity of light emitted from an LED that may produce high resolution light.

Yet another advantage of the present invention is to provide a system and/or a method for reading, measuring and/or controlling intensity of light emitted from an LED that may have applications in smoke detectors, control systems for pneumatic cylinders, bar code scanning technologies and/or the like.

Additional features and advantages of the present invention are described in, and will be apparent from, the detailed description of the presently preferred embodiments and from the drawings.

BRIEF DESCRIPTION OF THE DRAWINGS

FIG. 1 illustrates a top view of a system for reading, measuring and/or controlling intensity of light emitted from an LED in an embodiment of the present invention.

FIG. 2 illustrates a cross-sectional view taken generally along line I-I of FIG. 1 of a system for reading, measuring and/or controlling intensity of light emitted from an LED in an embodiment of the present invention.

FIG. 3A illustrates a top view of a system for reading, measuring and/or controlling intensity of light emitted from an LED in an embodiment of the present invention.

FIG. 3B illustrates a cross-sectional view taken generally along line IIIa-IIIa of FIG. 3A of a system for reading, measuring and/or controlling intensity of light emitted from an LED in an embodiment of the present invention.

FIG. 4 illustrates a top view of a system for reading, measuring and/or controlling intensity of light emitted from an LED in an embodiment of the present invention.

FIG. 5 illustrates a cross-sectional view taken generally along line IV-IV of FIG. 4 of a system for reading, measuring and/or controlling intensity of light emitted from an LED in an embodiment of the present invention.

FIG. 6 illustrates a top view of a system for reading, measuring and/or controlling intensity of light emitted from an LED in an embodiment of the present invention.

FIG. 7 illustrates a cross-sectional view taken generally along line VI-VI of FIG. 6 of a system for reading, measuring and/or controlling intensity of light emitted from an LED in an embodiment of the present invention.

FIG. 8 illustrates a top view of a system for reading, measuring and/or controlling intensity of light emitted from an LED in an embodiment of the present invention.

FIG. 9 illustrates a cross-sectional view taken generally along line VIII-VIII of FIG. 8 of a system for reading, measuring and/or controlling intensity of light emitted from an LED in an embodiment of the present invention.

DETAILED DESCRIPTION OF THE PRESENTLY PREFERRED EMBODIMENTS

Figure 10:
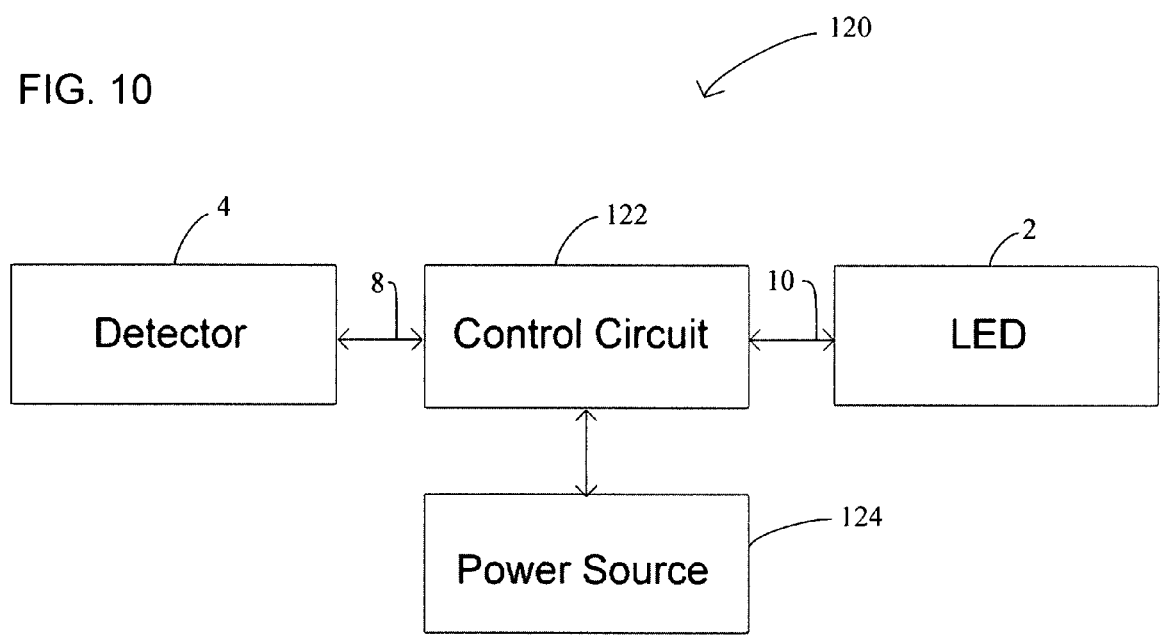
FIG. 10 illustrates a black box diagram of a system for reading, measuring and/or controlling intensity of light emitted from an LED in an embodiment of the present invention.

The present invention generally relates to a system and/or a method for reading, measuring and/or controlling intensity of light emitted from a light emitting diode (LED). More specifically, the present invention relates to a system and/or a method that may prevent and/or may retard reflection of ambient light from a surface of the LED to allow an accurate reading and/or an accurate measurement of the intensity of light emitted from the LED. The system and/or the method may have a light detector located in a position adjacent to the LED for reading and/or measuring the intensity of light emitted from the LED. The system and/or the method may have a control circuit that may be electrically connected to both the detector and the LED for measuring and/or controlling intensity of light emitted from the LED. A tower may surround the light detector. The tower may have a pathway that may allow only light emitted from the LED to reach the light detector. The housing and the pathway may limit and/or may prevent exposure of the light detector to ambient light that may not be emitted directly from the LED towards the light detector.

Referring now to the drawings wherein like numerals refer to like parts, FIGS. 1, 2, 3A, 3B and 4-10 illustrate systems 20, 40, 60, 80, 100, 120 and/or components of the systems 20, 40, 60, 80, 100, 120 for reading, measuring and/or controlling intensity of light emitted from an LED 2 in embodiments of the present invention. In an embodiment, the LED 2 may have optics for shaping a radiation pattern of the LED from an emitting surface 3 of the LED 2. The LED 2 may emit one or more colors of light, for example, blue light, red light, green light, white light and/or the like. The LED 2 may emit one or more types of light such as, for example, infrared light, visible light, ultraviolet light and/or the like. The present invention should not be deemed as limited to a specific embodiment of the LED 2. It should be understood that the LED 2 may be any LED as known to one having ordinary skill in the art.

In an embodiment, the emitting surface 3 of the LED 2 may have one or more finishes 5a and/or coatings 5b that may absorb ambient light and/or may prevent and/or may retard reflection of ambient light from the emitting surface 3 of the LED 2. The finishes 5a and/or the coatings 5b may be, for example, matte finishes and/or coatings that may allow light to escape the emitting surface while preventing and/or retarding ambient light from entering and/or being reflected by the emitting surface 3. The finishes 5a and/or the coatings 5b may effectively absorb ambient light on the emitting surface 3 of the LED 2. The finishes 5a and/or the coatings 5b may be produced by mechanically abrading and/or chemically altering the emitting surface 3 of the LED 2. In an embodiment the finishes 5a and/or the coatings 5b may be one or more filters and/or chemicals placed over the emitting surface 3 of the LED 2. The present invention should not be deemed as limited to a specific embodiment of the finishes 5a and/or the coatings 5b. It should be understood that the finishes 5a and/or coatings 5b may be any finishes and/or coatings for absorbing ambient light and/or preventing and/or retarding reflection of ambient light as known to one having ordinary skill in the art.

Further, FIGS. 1, 2, 3A, 3B and 4-10 generally illustrate a detector 4 that may be, for example, a light intensity detector, a photodiode, a phototransistor and/or other like detector that may output a current and/or a voltage as a function of light intensity detected. The detector 4 may read and/or may measure an intensity of light emitted from the LED 2. As shown in FIG. 10, the detector 4 may be electrically connected to a control circuit 122 with an electrical connection 8. The electrical connection 8 may be any electrically conductive connection, such as, for example, one or more wires, leads, solder joints and/or the like. The present invention should not be deemed as limited to a specific embodiment of the detector 4. It should be understood that the detector 4 may be any detector for reading and/or measuring light intensity as known to one having ordinary skill in the art.

As shown in FIG. 10, the control circuit 122 may be electrically connected to the LED 2 with an electrical connection 10. The electrical connection 10 may be any electrically conductive connection, such as, for example, one or more wires, leads, solder joints and/or the like. The control circuit 122 may be electrically connected to a power source 124, such as, for example, a battery, an electrical grid and/or the like. The control circuit 122 may provide power to the LED 2 and/or to the detector 4. The control circuit 122 may be, for example, an analog circuit, a digital circuit and/or the like. The control circuit 122 may determine an intensity of light 1 emitted from the LED 2 by monitoring a voltage and/or a current produced by the detector 4 in response to an absorption of light 1 by the detector 4. The control circuit 122 may instantaneously change a voltage and/or a current applied to the LED 2 to regulate the intensity of light 1 emitted from the LED 2. The control circuit 122 may be used to regulate the intensity of light 1 emitted from the LED to be substantially uniform and/or stable over a period of time. The present invention should not be deemed as limited to a specific embodiment of the control circuit 122. It should be understood that the control circuit 122 may be any control circuit for measuring light intensity and/or regulating voltage and/or current applied to an LED as known to one having ordinary skill in the art.

FIGS. 1, 2, 3A, 3B, 5, 7 and 9 generally illustrate a surface 6. The surface 6 may be a platform for securing the LED 2, the detector 4 and/or one or more components of the systems 20, 40, 60, 80, 100, 120. The surface 6 may be, for example, a printed circuit board, a plastic surface, a metal surface and/or the like. The surface 6 may provide electrical connections 8, 10 for the detector 4 and/or the LED 2, respectively. The surface 6 may be any surface capable of holding the LED 2, the detector 4 and/or one or more components of the systems 20, 40, 60, 80, 100, 120. The surface 6 may be a surface of an environment in which the systems 20, 40, 60, 60, 100, 120 may be situated. The present invention should not be deemed as limited to a specific embodiment of the surface 6. It should be understood that the surface 6 may be any surface as known to one having ordinary skill in the art.

In an embodiment as illustrated in FIGS. 1 and 2, the system 20 may have a tower 22. The tower 22 may have a perimeter 28 defining an external surface 29. Further, the tower 22 may have a height defined between a top end 30 and a bottom end 32. The bottom end 32 may be located in a position generally opposite to the top end 30. In an embodiment, the tower 22 may be generally cylindrical. In an embodiment, the tower 22 may be constructed from an opaque material, such as, for example, metal, plastic and/or the like. In an embodiment, the tower 22 may have a compartment 26 that may be located entirely within the perimeter 28 of the tower 22.

The detector 4 may be situated within the compartment 26. The compartment 26 may have a perimeter 34 that may surround the detector 4. Further, the compartment 26 may have a height defined between a top side 36 and a bottom side 38 located in a position generally opposite to the top side 36. The tower 22 and/or the compartment 26 may be a housing for holding the detector 4. The tower 22 and/or the compartment 26 may prevent the detector 4 from being exposed to ambient light located outside the perimeters 28, 34. Moreover, the tower 22 may be mounted upright on the surface 6. The present invention should not be deemed as limited to a specific embodiment of the tower 22 and/or the compartment 26. It should be understood that the tower 22 and/or the compartment 26 may be any shape and/or material that may house the detector 4 as known to one having ordinary skill in the art.

In an embodiment, the tower 22 and/or the compartment 26 may be milled from the opaque material. In another embodiment, the tower 22 and/or the compartment 26 may be formed by drilling, melting, machining, extruding and/or molding the opaque material.

As shown in FIGS. 1 and 2, the tower 22 may have a channel 24 that may extend at an angle from the external surface 29 of the tower 22 to the compartment 26. In an embodiment, the channel 24 may extend at the angle from the bottom end 32 of the tower 22 towards the top end 30 of the tower 22. As shown in FIGS. 1 and 2, the channel 24 may be tubular in shape and may have a diameter. The channel 24 may be sized to allow a readable amount of light 1 to reach the detector 4. The channel 24 may be, for example, a drilled hole in the tower 22. In an embodiment, the LED 2 may be mounted upright on the surface 6 and may be situated adjacent to the tower 22. The light 1 emitted from the emitting surface 3 of the LED 2 may travel through the channel 24 and may be read and/or measured by the detector 4 situated in the compartment 26 of the tower 22. The system 20 may be situated in an environment containing ambient light emitted from the LED 2 and/or containing ambient light emitted and/or reflected from other sources. The angle of the channel 24 with respect to the emitting surface 3 of LED 2 and/or the position of the tower 22 may reduce and/or may prevent exposure of the detector 4 to ambient light via the channel 24. Further, one or more of the finishes 5a and/or the coatings 5b of the emitting surface 3 of the LED 2 may absorb ambient light and/or may prevent and/or may retard reflection of ambient light into the channel 24. As a result, the detector 4 may accurately read and/or detect the intensity of the light 1 emitted by the LED 2.

In an embodiment, as illustrated in FIGS. 3A and 3B, the system 40 may have a tower 42. The tower 42 may have a perimeter 48 defining an external surface 49. Further, the tower may have a height defined between a top end 50 and a bottom end 52 that may be located in a position generally opposite to the top end 50. The tower 42 may have a compartment 46 that may be located entirely within the perimeter 48 of the tower 42.

The compartment 46 may have may have a height defined between a top side 56 and a bottom side 58 that may be located in a position generally opposite to the top side 56. The compartment 46 may have a perimeter 54. The detector 4 may be situated within the tower 42 and/or the compartment 46. The tower 42, and/or the compartment 46 may prevent the detector 4 from being exposed to ambient light located outside of the perimeters 48, 54. The present invention should not be deemed as limited to a specific embodiment of the tower 42 and/or the compartment 46. It should be understood that the tower 42 and/or the compartment 46 may be any shape and/or material that may prevent exposure of the detector 4 to ambient light as known to one having ordinary skill in the art.

As shown in FIGS. 3A and 3B, the tower 42 may have a tube 44 that may extend at an angle from the compartment 46 of the tower 42 to a position adjacent to and external to the tower 42. The tube 44 may have a length defined between a first end 43 and a second end 45 that may be located in a position generally opposite to the second end. In an embodiment, the tube 44 may extend at an angle from the top end 50 of the tower 42 towards the surface 6 and/or the LED 2. As shown in FIGS. 3A and 3B, the tube 44 may be tubular in shape and may have a diameter. The tube 44 may be sized to allow a readable amount of light 1 to reach the detector 4. The tube 44 may be, for example, a pipe and/or other like member that may allow the light 1 to enter and/or leave the first end 43 and/or the second end 45. The tube 44 may prevent ambient light from entering the tube 44 between the first end 43 and the second end 45. In an embodiment, the LED 2 may be mounted upright on the surface 6 and may be situated adjacent to the tower 42. The light 1 emitted from the emitting surface 3 of the LED 2 may travel through the tube 44 and may be read and/or measured by the detector 4 that may be situated in the compartment 46 of the tower 42.

The system 40 may be situated in an environment containing ambient light emitted from the LED 2 and/or containing ambient light emitted and/or reflected from other sources. The angle of the tube 44 with respect to the emitting surface 3 of the LED 2 and/or the position of the tower 42 may reduce and/or may prevent exposure of the detector 4 to ambient light via the tube 44. Further, one or more of the finishes 5a and/or the coatings 5b of the emitting surface 3 of the LED 2 may absorb ambient light and/or may prevent and/or may retard reflection of ambient light into the tube 44. As a result, the detector 4 may accurately read and/or detect the intensity of the light 1 emitted by the LED 2 through the tube 44.

In an embodiment, as illustrated in FIGS. 4 and 5, the system 60 may have a tower 62. The tower 62 may have a length defined between a back surface 72 and a front surface 74 that may be located in a position generally non-parallel to the back surface 72. The tower 62 may have a width defined between a first end 68 and a second end 70 that may be located in a position generally opposite to the first end 68. In an embodiment, a profile of the tower 62 may be generally triangular. In an embodiment, the front surface 74 may be a mirror and/or other like surface capable of reflecting light. In an embodiment, the tower 62 may have a compartment 66 that may be located entirely between the front surface 74 and the back surface 72 and between the first end 68 and the second end 70 of the tower 62. The compartment 66 may have a perimeter 67. The detector 4 may be situated within the tower 62 and/or the compartment 66. The tower 62 and/or the compartment 66 may prevent the detector 4 from being exposed to ambient light outside of the perimeter 67. The present invention should not be deemed as limited to a specific embodiment of the tower 62 and/or the compartment 66. It should be understood that the tower 62 and/or the compartment 66 may be any shape and/or material that may house the detector 4 as known to one having ordinary skill in the art. Moreover, the front surface 74 of the tower 62 may be any surface capable of reflecting light as known to one having ordinary skill in the art.

As shown in FIGS. 4 and 5, the tower 62 may have a channel 64 that may extend generally parallel to the surface 6 from the front surface 74 of the tower 62 to the compartment 66. As shown in FIGS. 4 and 5, the channel 64 may be tubular in shape and may have a diameter. The channel 64 may be sized to allow a readable amount of the light 1 to reach the detector 4. The channel 64 may be, for example, a drilled hole in the tower 62. In an embodiment, the LED 2 may be mounted sideways on the surface 6 and may be situated adjacent to the tower 62. The emitting surface 3 of the LED 2 may be directed at the front surface 74 and/or may be generally parallel to the back surface 72. The light 1 emitted from the emitting surface 3 of the LED 2 may travel through the channel 64 and may be read and/or measured by the detector 4 that may be situated in the compartment 66 of the tower 62. Additional light 1 emitted by the LED 2 may be reflected by the front surface 74 away from the tower 62 and/or the LED 2. An angle of reflection may depend on an angle of the front surface 74 with respect to the emitting surface 3 of the LED 2. In an embodiment, the angle of the front surface with respect to the emitting surface 3 may be, for example, forty-five (45) degrees which may reflect the additional light outward with respect to the surface 6.

The system 60 may be situated in an environment containing ambient light emitted from the LED 2 and/or containing ambient light emitted and/or reflected from other sources. A position of the LED 2 with respect to the front surface 74 of the tower 62 may reduce and/or may prevent exposure of the detector 4 to ambient light via the channel 64. Further, one or more of the finishes 5a and/or the coatings 5b of the emitting surface 3 of the LED 2 may absorb ambient light and/or may prevent and/or may retard reflection of ambient light into the channel 64. As a result, the detector 4 may accurately read and/or detect the intensity of the light 1 emitted by the LED 2 through the channel 64.

In an embodiment, as illustrated in FIGS. 6 and 7, the system 80 may have a chamber 82. The chamber 82 may have a perimeter 84 defining an external surface 85. Further, the chamber 82 may have a height defined between a top end 96 and a bottom end 98 that may be located in a position generally opposite to the top end 96. In an embodiment, the chamber 82 may be generally cylindrical. In an embodiment, the top end 96 of the chamber 82 may have an aperture 99 for allowing ambient light into the chamber 82. The aperture 99 may be generally round. In embodiment, the chamber 82 may have a lens 90 sized to fit inside and may cover the aperture 99. The lens 90 may be, for example, a ball lens. The chamber 82 may have a compartment 86 that may be located entirely within the perimeter 84 of the chamber 82. The compartment 86 may have a perimeter 88 that may surround the detector 4 and one or more of the LEDs 2. The chamber 82 and/or the compartment 86 may be a housing for holding the detector 4, one or more LEDs 2 and/or a member 92. The member 92 may extend from the surface 6 to a position between the aperture 99 and the bottom end 98 of the chamber 82. The member 92 may have a top surface 94 that may be substantially parallel to the aperture 99 and/or the lens 90. The top surface 94 of the member 92 may be designed to absorb light and/or to reflect light entering the chamber 82 through the lens 90. In an embodiment, the member 92 may be, for example, a flathead screw that may be painted black. The chamber 82, the compartment 86, the lens 99 and/or the member 92 may prevent the detector 4 from being exposed to ambient light outside of the perimeters 84, 88. Moreover, the chamber 82 and/or the LEDs 2 may be mounted upright on the surface 6. The present invention should not be deemed as limited to a specific embodiment of the chamber 82, the compartment 86, the aperture 99, the lens 90 and/or the member 92. It should be understood that the chamber 82, the compartment 86, the aperture 99, the lens 90 and/or the member 92 may be any chamber, compartment, aperture, lens and/or member, respectively, as known to one having ordinary skill in the art.

As shown in FIGS. 6 and 7, the LEDs 2 may be mounted upright on the surface 6 and may be situated adjacent to the perimeter 88 of the compartment 86. The light 1 emitted from the emitting surface 3 of the LEDs 2 may travel and/or may be reflected around the chamber 82. The light 1 emitted from the emitting surface may be focused by the lens 90 and may be transmitted outside of the chamber 82 to a focal point outside of the chamber 82. Further, the light 1 emitted from the LEDs 2 may be read, measured and/or detected by the detector 4 situated in a position adjacent to the LEDs within the compartment 86 of the chamber 82.

The system 80 may be situated in an environment containing ambient light emitted from the LEDs 2 and/or containing ambient light emitted and/or reflected from other sources. Ambient light outside of the chamber 82 may be focused by the lens 90 onto the top surface 94 of the member 92. The top surface 94 of the member 92 may absorb the focused light and/or may reflect the focused light towards the lens 90. Further, one or more of the finishes 5a and/or the coatings 5b of the emitting surface 3 of the LEDs 2 may absorb excess ambient light and/or may prevent and/or may retard reflection of excess ambient light in a direction towards the detector 4. Further, the light 1 emitted from the LEDs 2 may be focused by the lens 90 outside of the chamber 82 to illuminate the environment. In an embodiment, the system 80 may have an ambient light detector 81 that may detect the intensity of ambient light in the environment outside of the chamber 82.

In an embodiment, as illustrated in FIGS. 8 and 9, the system 100 may have a chamber 102. The chamber 102 may have a perimeter 104 defining an external surface 105. Further, the chamber 102 may have a height defined between a top end 114 and a bottom end 116 that may be located in a position generally opposite to the top end 114. In an embodiment, the top end 114 of the chamber 102 may have a channel 110 to allow ambient light into the chamber 102. In an embodiment, the channel 110 may be generally tubular in shape.

In an embodiment, the chamber 102 may have a compartment 106 having a perimeter 108 that may be located entirely within the perimeter 104 of the chamber 102. The chamber 102 and/or the compartment 106 may be a housing for holding the detector 4, the LED 2 and/or a member 112. The member 112 may extend from the perimeter 108 of the compartment 106 to a position between the channel 102 and the bottom end 116 of the chamber 102. The member 112 may have a top surface 113 that may be substantially parallel to the top end 114 of the chamber 102. The top surface 113 of the member 112 may be designed to absorb light and/or to reflect light entering the chamber 102 through the channel 110. The chamber 102, the compartment 106, and/or the member 112 may prevent the detector 4 from being exposed to ambient light outside of the perimeters 104, 108. The present invention should not be deemed as limited to a specific embodiment of the chamber 102, the compartment 106, the channel 110, and/or the member 112. It should be understood that the chamber 102, the compartment 106, the channel 110 and/or the member 112 may be any chamber, compartment, channel and/or member, respectively, as known to one having ordinary skill in the art.

As shown in FIGS. 8 and 9, the LED 2 may be mounted upright on the surface 6 and may be situated adjacent to the perimeter 108 of the compartment 106. The light 1 emitted from the emitting surface 3 of the LED 2 may escape the chamber 102 through the channel 110. Further, the light 1 emitted from the LED 2 may be read, measured and/or detected by the detector 4 situated in a position adjacent to the LED within the compartment 106 of the chamber 102.

Ambient light outside of the chamber 102 may enter the chamber 102. The top surface 113 of the member 112 may absorb the ambient light and/or may reflect the ambient light towards and/or out of the chamber 102 through the channel 110. Further, one or more of the finishes 5a and/or the coatings 5b of the emitting surface 3 of the LED 2 may absorb excess ambient light and/or may prevent and/or may retard reflection of excess ambient light in a direction towards the detector 4.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A system for controlling light emitted from a light source in an environment having ambient light, the system comprising:

an LED to emit light wherein the light emitted from the LED has an intensity wherein the LED has an emitting surface to transmit the light emitted from the LED wherein the emitting surface of the LED has a finish wherein the finish of the emitting surface of the LED retards reflection of the ambient light from the emitting surface of the LED and further wherein the finish of the emitting surface of the LED allows the light emitted from the LED through the emitting surface of the LED to pass through the finish and into the environment;

a detector adjacent to the LED to detect the intensity of the light emitted directly from the emitting surface of the LED;

a control circuit for monitoring the intensity of the light detected by the detector wherein the control circuit is electrically connected to the detector and the LED wherein the control circuit regulates the intensity of light emitted by the LED; and a tower having an internal compartment that surrounds the detector wherein the tower prevents exposure of the detector to the ambient light wherein the tower has an external surface and a pathway wherein the pathway is located between the detector inside the internal compartment and the external surface to transmit the light emitted directly from the emitting surface of the LED to the detector in the compartment.

2. The system of claim 1 wherein the tower is constructed from an opaque material.

3. The system of claim 1 further comprising:
a channel in the tower that extends from the internal compartment to the external surface of the tower.

4. The system of claim 1 further comprising:
a pipe that extends from the internal compartment past the external surface of the tower to a position adjacent to the emitting surface of the LED.

5. The system of claim 1 further comprising:
a mirror on the external surface of the tower that reflects the light emitted from the LED away from the tower.

6. The system of claim 1 further comprising:
a surface that is substantially flat wherein the tower and the LED are mounted to the surface wherein the surface is a printed circuit board.

7. The system of claim 1 further comprising:
a power source electrically connected to the control circuit wherein the power source provides power to the LED.

8. The system of claim 1 wherein the emitting surface is abraded to reduce reflection of ambient light from the emitting surface.

9. The system of claim 1 further comprising:
a coating on the emitting surface that reduces reflection of the ambient light from the emitting surface.

10. A system for reading light emitted from a light source in an environment having ambient light, the system comprising:

an LED to emit light wherein the light emitted from the LED has an intensity wherein the LED has an emitting surface having a finish wherein the finish of the emitting surface of the LED reduces reflection of light from the emitting surface of the LED and further wherein the finish of the emitting surface of the LED allows the light emitted from the LED through the emitting surface of the LED to pass through the finish;

a first detector adjacent to the LED to detect the intensity of light emitted directly from the LED;

a chamber in the environment having an internal compartment that surrounds the first detector and the LED wherein the chamber has an aperture to allow transmission of the light emitted from the LED out of the chamber wherein the aperture allows transmission of the ambient light into the chamber; and means for preventing exposure of the LED and the first detector to the ambient light that is transmitted into the chamber through the aperture wherein the means for preventing allows the light emitted from the LED to exit the chamber through the aperture.

11. The system of claim 10 further comprising:
a control circuit for monitoring the intensity of light detected by the detector wherein the control circuit is electrically connected to the first detector and the LED wherein the control circuit regulates the intensity of light emitted from the LED.

12. The system of claim 10 further comprising:
a lens sized to fit into the aperture wherein the lens focuses the light emitted from the LED through the aperture to the environment wherein the lens focuses the ambient light from the environment onto the means for preventing.

13. The system of claim 10 further comprising:
a surface located between the aperture and the first detector wherein the surface absorbs the ambient light that is transmitted through the aperture into the internal compartment of the chamber.

14. The system of claim 10 further comprising:
a surface located between the aperture and the first detector wherein the surface reflects the ambient light that is transmitted through the aperture into the chamber through the aperture.

15. The system of claim 10 further comprising:
a second detector located in a position outside of the chamber to detect an intensity of the ambient light in the environment outside of the chamber.

* * * * *